United States Patent
Leem et al.

(10) Patent No.: US 7,720,128 B2
(45) Date of Patent: May 18, 2010

(54) LASER DIODE GENERATING PASSIVE MODE AND METHOD OF CREATING OPTICAL PULSE USING THE SAME DIODE

(75) Inventors: Young Ahn Leem, Daejeon (KR); Eun Deok Sim, Daejeon (KR); Dong Churl Kim, Daejeon (KR); Kyung Hyun Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/438,201

(22) Filed: May 22, 2006

(65) Prior Publication Data

US 2007/0091942 A1   Apr. 26, 2007

(30) Foreign Application Priority Data

Oct. 25, 2005   (KR) .................. 10-2005-0100872

(51) Int. Cl.
*H01S 3/08* (2006.01)
(52) U.S. Cl. ......................................... 372/96
(58) Field of Classification Search .............. 372/18, 372/96
See application file for complete search history.

(56) References Cited

U.S. PATENT DOCUMENTS

| | | | |
|---|---|---|---|
| 5,586,138 A * | 12/1996 | Yokoyama | 372/97 |
| 6,031,860 A * | 2/2000 | Nitta et al. | 372/50.11 |
| 6,122,306 A * | 9/2000 | Sartorius et al. | 372/96 |
| 6,542,522 B1 | 4/2003 | Arahira | |
| 6,614,817 B2 * | 9/2003 | Nomura et al. | 372/18 |
| 6,822,982 B2 | 11/2004 | Yoshida et al. | |
| 6,826,203 B1 | 11/2004 | Granestrand | |
| 2001/0005388 A1 * | 6/2001 | Hirata et al. | 372/22 |
| 2003/0086449 A1 * | 5/2003 | Jacquet et al. | 372/25 |

(Continued)

FOREIGN PATENT DOCUMENTS

KR   1020040054073   6/2004

(Continued)

OTHER PUBLICATIONS

Liu et al., "Tuning Characteristics of Monolithic Passively Mode-Locked Distributed Bragg Reflector Semiconductor Lasers", Nov. 11, 1996, IEEE, Journal of Quantum Electronics, vol. 32, No. 11, 1965-1975.*

(Continued)

*Primary Examiner*—Minsun Harvey
*Assistant Examiner*—Joshua King
(74) *Attorney, Agent, or Firm*—Ladas & Parry LLP

(57) ABSTRACT

Provided are a laser diode generating passive mode locking that does not contain non-linear sector of an SA, and a method of creating an optical pulse using the same diode. The laser diode includes a DFB sector serving as a reflector and a gain sector. The gain sector is connected to the DFB sector and includes an as-cleaved facet formed at the end of the gain sector. When a current less than a threshold current is applied to the DFB sector to allow the DFB sector to operate as a reflector, passive mode locking occurs swiftly and therefore a sector of the SA is not required, which makes manufacturing simple. Also, it is possible to effectively extend a frequency variable region compared to using of the SA.

20 Claims, 5 Drawing Sheets

U.S. PATENT DOCUMENTS

2004/0125851 A1* 7/2004 Park et al. .................... 372/97

FOREIGN PATENT DOCUMENTS

KR 1020050064120 6/2005
KR 1020050064508 6/2005

OTHER PUBLICATIONS

Nishimura et al., "Passively Mode-Locked Pulse Generation at 40 GHz Repetition Rate by Semiconductor Lasers with Distributed Bragg Reflector for Oscillating Mode Control", Apr. 2003, The Japan Society of Applied Physics, Jpn. J. Appl. Phys., vol. 42, 2325-2328.*

Arahira et al., "Mode-Locking at Very High Repetition Rates More than Terahertz in Passively Mode-Locked Distributed-Bragg-Reflector Laser Diodes", Jul. 7, 1996, IEEE, Journal of Quantum Electronics, vol. 32, No. 7, 1211-1224.*

Mohrle et al., "Electrically Switchable Self-Pulsations in Integratable Multisection DFB-Lasers", Jan. 1996, IEEE, Photonics Technology Letters, vol. 8, No. 1, 28-30.*

Sartorius et al., "Direct modulation of lasers by dispersive threshold switching", 1996, IPRM, Eight International Conference on, 155-157.*

Yoshikuni et al., "Broad Wavelength Tuning Under Single-Mode Oscillation with a Multi-Electrode Distributed Feedback Laser", Oct. 23, 1986, IEEE, Electronics Letters, vol. 22, No. 22, 1153-1154.*

'Polarization Insensitive 40 GHz Self-Pulsating DBR Lasers with Enhanced Nonlinearities and Wide Self-Pulsation Frequency Tunability' Renaudier et al., Alcatel-Thales III-V Lab, Alcatel Research & Innovation, France et al., 2005 Optical Society of America.

J. Renaudier, et al; "Phase Correlation Between Longitudinal Modes in Semiconductor Self-Pulsating DBR Lasers" IEEE Photonics Technology Letters, vol. 17, No. 4, Apr. 2005, pp. 741-743.

* cited by examiner

LASER DIODE GENERATING PASSIVE MODE AND METHOD OF CREATING OPTICAL PULSE USING THE SAME DIODE

CROSS-REFERENCE TO RELATED PATENT APPLICATION

This application claims the benefit of Korean Patent Application No. 10-2005-0100872, filed on Oct. 25, 2005, in the Korean Intellectual Property Office, the disclosure of which is incorporated herein in its entirety by reference.

BACKGROUND OF THE INVENTION

1. Field of the Invention

The present invention relates to a laser diode, and more particularly, to a laser diode generating passive mode locking that does not contain non-linear sector of a saturable absorber (SA), and a method of creating an optical pulse using the same diode.

2. Description of the Related Art

An optical pulse is utilized in a variety of fields such as a clock reproduction by a 3R reproducer (re-amplifying, re-shaping, re-timing) in optical communication, a light source in the optical communication, a light source for light sampling, a carrier for radio frequency (RF) communication. Particularly, when an optical pulse is produced using a semiconductor laser diode, it is very advantageous in aspects of the size and economics of a device. Therefore, lots of researches on a pulse laser diode have been made.

Physical mechanism that causes a laser diode to emit a pulse is Q-switching, gain switching, mode beating, or mode locking. Since an RF signal is used in case of the Q-switching or gain switching, there are limitations due to the speed of an electronic device and a response speed of a laser diode. In case of the mode beating, a laser diode having a plurality of distributed feedback (DFB) sectors is generally used. However, a very precise process is required to form these DFB sectors.

The mode locking is roughly divided into active mode locking and passive mode locking. The active mode locking modulates to the same frequency as a mode interval using a modulator within the laser diode and performs phase locking (meaning fixing a phase difference between modes). Since the active mode locking performs the phase locking using an external RF signal, it has the same problems as those of the Q-switching.

Therefore, the passive mode locking is preferred. In case of the passive mode locking, a non-linear sector of a saturable absorber (SA) is input in the laser diode to perform the phase locking. However, since the passive mode locking includes the non-linear sector of the SA, it has a complicated structure. Also, according to a prior art passive mode locking, the width of a variable frequency is small, so that there is manufacturing difficulty. For example, when a reference frequency is 40 GHz, the width of a variable frequency is less than 1 GHz (2.5%). Therefore, it is difficult to adjust a frequency to a reference frequency by applying a current after forming a device. Therefore, a device should be precisely manufactured. This problem also occurs in relation to the active mode locking.

Also, there is a laser diode including a single DFB sector and using the mode beating. The laser diode using such mode beating includes a DFB sector, a phase control sector, and a gain sector, and creates an optical pulse using mode beating occurring between compound cavity modes. In detail, when a current equal to or greater than a threshold current is applied to the DFB sector, the DFB sector operates as a single mode laser to emit light a phase control sector and a gain sector. The emitted light passes through the phase control sector and the gain sector, and is reflected by an as-cleaved facet (a cut plane of the end of the gain sector) to return back to the DFB sector. By such reflection, the entire device does not operate as a single mode but oscillates in two modes. The device creates an optical pulse using beating between the two modes.

The laser diode using the mode beating does not use an SA but uses only two modes and therefore has limitation in creating various optical pulses.

A research on a passive mode locking laser diode using a distributed brag reflector (DBR) is under progress. As reported, a normal wave guide structure does not create a pulse swiftly. However, when the wave guide is formed in an almost square, a pulse is swiftly created. In more detail, the cross-section of a wave guide of a general laser diode has a size of 1 μm in horizontal length and 0.3 μm in vertical length. On the other hand, a wave guide for the passive mode locking has an almost square-shaped cross-section of 0.7 μm in horizontal length and 0.5 μm in vertical length.

Currently, interaction between non-linear modes such as four wave mixing (FWM) is drawing attention as a reason generating the passive mode locking. The wave guide structure having the square cross-section also increases only a light restriction coefficient of the wave guide to increase the non-linear effect. Here, the light restriction coefficient describes a degree a wave guide restricts light.

However, it is particularly difficult to manufacture a wave guide having a shape close to a square in case of the laser diode using the DBR.

SUMMARY OF THE INVENTION

The present invention provides a laser diode having a simple structure not containing a sector of an SA and generating passive mode locking that provides a wide variable frequency width and a method of creating an optical pulse using the same diode.

According to an aspect of the present invention, there is provided a laser diode generating passive mode locking, the laser diode including: a DFB sector serving as a reflector; and a gain sector connected to the DFB sector and having an as-cleaved facet formed at the end of the gain sector.

The laser diode may be a single cavity laser diode to use the DFB sector as a reflector by applying a current less than a threshold current to the DFB sector.

Optical pulse of various frequencies is created by controlling a current applied to the DFB sector.

According to another aspect of the present invention, there is provided a method of creating an optical pulse, the method including: providing a laser diode containing a DFB sector serving as a reflector and a gain sector connected to the DFB sector and having an as-cleaved facet formed at the end of the gain sector; and applying a current to the DFB sector of the laser diode to create an optical pulse by generating passive mode locking.

It may be possible to generate the passive mode locking and therefore create the optical pulse by applying a current less than a threshold current to the DFB sector. Also, It may be possible to determine the number of modes and the width of the optical pulse by controlling a ratio of the DFB's reflection spectrum width to an entire cavity's mode interval.

The present invention describes that a new type of pulse is created using the above-described mode beating of a laser diode. That is, when a current less than the threshold current is applied to the DFB sector, the DFB sector serves simply as a reflector and therefore a new corresponding pulse is created. Since the DFB sector serves simply as the reflector, the structure of an entire device describing the creation of the optical pulse may be a single cavity laser diode where reflection at the cleaved facet and reflection at the DFB sector constitute a resonator. Also, physical phenomenon that may be related to such a structure is Q-switching or mode locking. The passive mode locking may be pertinent in consideration of a frequency change according to the device's length.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
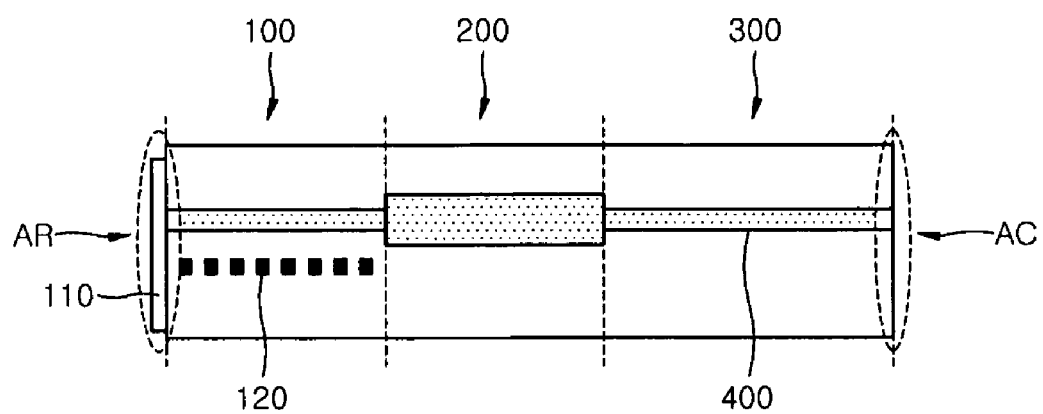
FIG. 1 is a schematic sectional view of a laser diode according to the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To facilitate understanding, identical reference numerals have been used, where possible, to designate identical elements that are common to the figures.

FIG. 1 is a schematic sectional view of a laser diode according to the present invention. Referring to FIG. 1, the laser diode includes a DFB sector 100 serving as a reflector, a phase control sector 200, and a gain sector 300. An anti-reflection (AR) sector including an anti-reflection coating (ARC) layer 110 is formed at the left end of the DFB sector 100. Also, as-cleaved facet (AC) is formed at the right end of the gain sector 300. Also, a waveguide 400 is formed along an entire device.

According to the present embodiment, a current less than a threshold current is applied to the DFB sector 100 to use the DFB sector 100 simply as a reflector. That is, when a current equal to or higher than the threshold current is applied to the DFB sector 100, the laser diode oscillates over the phase control sector and the gain sector. On the other hand, when a current less than a threshold current is applied to the DFB sector 100, the DFB sector 100 does not create a mode but serves only as a reflector with respect to a mode oscillated in the gain sector. Here, reflection occurred in the DFB sector 100 is reflection of probability through gratings 120 formed in the DFB sector 100. Therefore, the laser diode according to the present embodiment constitutes a resonant cavity as a whole using the reflection at the as-cleaved facet and the reflection by the reflector in the DFB sector. The phase control sector swiftly creates a pulse and controls the frequency of an optical pulse by controlling the amount of a current applied thereto.

Figure 2:
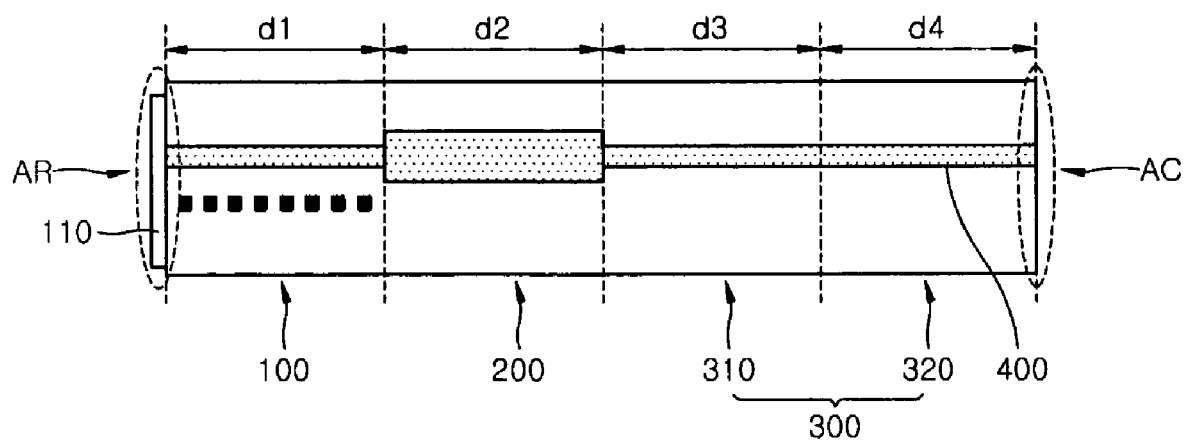
FIG. 2 is a schematic sectional view of a laser diode generating an optical pulse of about 10 GHz or more according to a first embodiment of the present invention.

FIG. 2 is a schematic sectional view of a laser diode generating an optical pulse of about 10 GHz or more according to a first embodiment of the present invention. Because the length of a device increases to uniformly apply a current, a gain sector 300 is divided into two sections. The DFB sector 100 is 0.4 mm (d1) in length, the phase control sector 200 is 0.5 mm (d1) in length, and the two divided gain sections 310 and 320 are 1 mm (d3) and 1.5 mm (d4) in length, respectively. Therefore, the length of an entire device is 3.4 mm in length.

Figure 3:
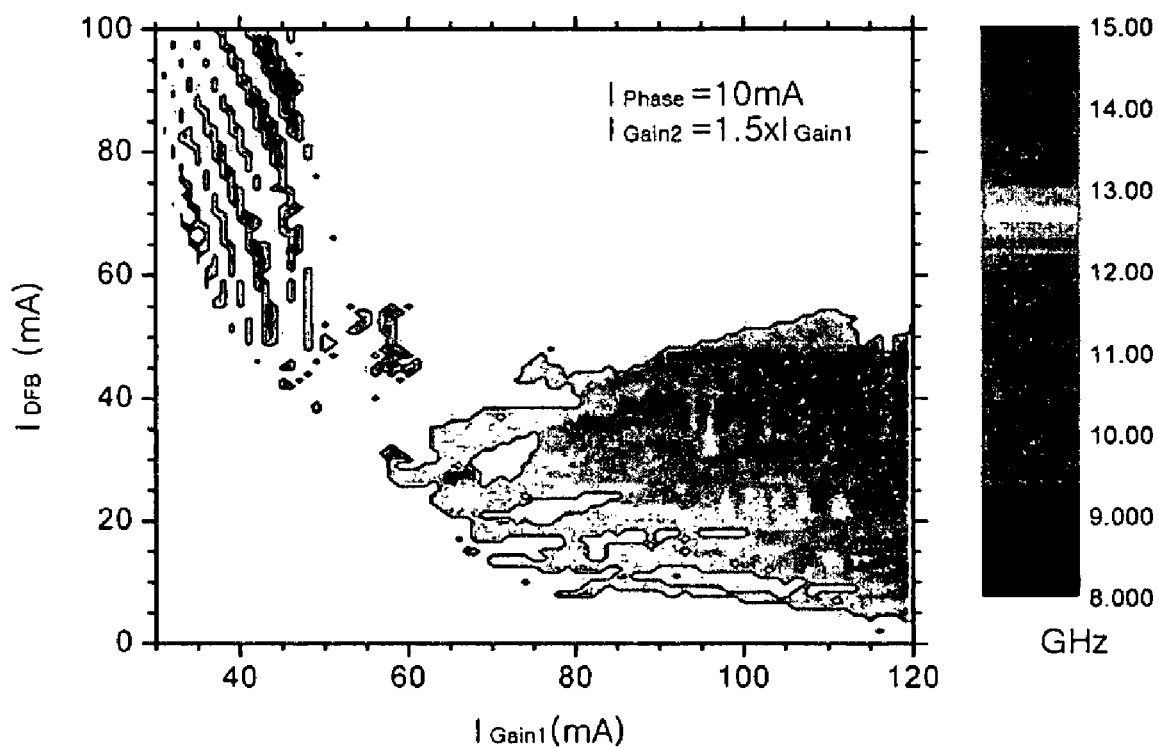
FIG. 3 is a frequency map of optical pulses created depending on the amount of a current applied to a DFB sector and a gain sector of the laser diode of FIG. 2.

FIG. 3 is a frequency map of optical pulses created depending on the amount of currents applied to a DFB sector 100 (vertical axis) and a gain sector 300 (horizontal axis) of the laser diode of FIG. 2. Referring to FIG. 3, the upper left region is a pulse creation region by a compound cavity mode beating generated when a current equal to or greater than a threshold current is applied to the DFB sector 100, and the lower right region is a pulse creation region to be described in the present invention. A threshold current for the DFB sector is 55 mA. As illustrated in FIG. 3, when a current less than the threshold current is applied to the DFB sector, a pulse is created over a very wide range.

Creation of the pulse over the wide range extends an available frequency region and increases production yield. According to this device, a pulse has been created in a region ranging from 11.2 GHz to 12.8 GHz, and tuning for 10% of a reference frequency is guaranteed. The tuning value, 10% of the reference frequency, is two times greater than that of the prior art passive mode locking that uses the SA. Therefore, a strict condition for a length is relaxed during a process.

Figure 4A:
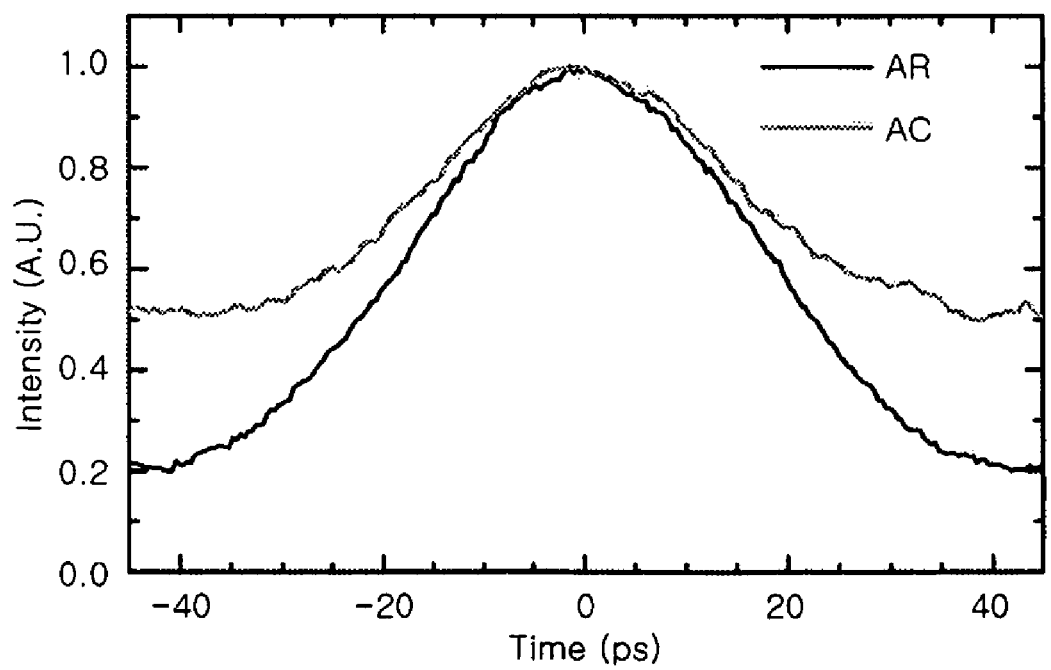
FIGS. 4A and 4B are graphs illustrating a reason a laser diode of the present invention can create a pulse over a wide range.
Figure 4B:
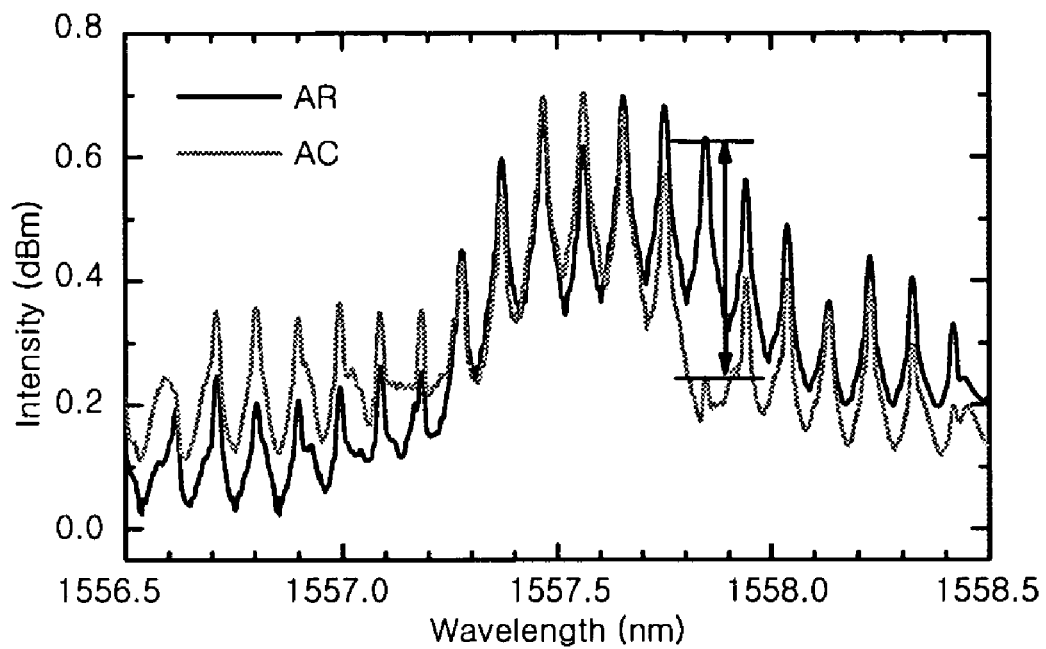

FIGS. 4A and 4B are graphs illustrating a reason a laser diode of the present invention can create a pulse over a wide range. Passive mode locking in a structure that does not contain an SA is understood as phase locking due to a non-linear interaction such as an FWM between modes. Considering the non-linear interaction such as the FWM between modes, a method of growing a light restriction coefficient to increase the non-linearity has been suggested. However, as described above, it is difficult to manufacture such a waveguide.

According to the present invention, the DFB sector in a general waveguide structure is used as a simple reflector (referred to as a DFB reflector hereinafter). Since the DFB reflector unlike a DBR uses the same active layer as that of the gain sector for the waveguide, a greater non-linear interaction between oscillation modes than a non-linear interaction of the DBR is generated.

FIG. 4A is a graph illustrating the role of a DFB through an experiment. That is, the graph compares results outputted from an anti-reflection (AR) coating layer and those outputted from an as-cleaved (AC) facet. Referring to FIG. 4A, values of outputs from the AR and the AC are measured by an autocorrelator trace, which is an intensity measurement device. As illustrated in FIG. 4A, the outputs from the AR have a greater extinction ratio (ER) than those from the AC. That is, the outputs from the AR deceases almost twice compared to those from the AC. The ER is a barometer representing a degree the highest point of the intensity decreases to the lowest point of the intensity. The ER is represented by 10 log (A/B). Here, 'A' represents the highest intensity and 'B' is an intensity at the bottom region. Therefore, ER is a barometer representing a degree light has a pulse shape.

FIG. 4B is a graph comparing optical spectrums between the two outputs. Referring to FIG. 4B, intensity of a mode in a long wavelength from the AR becomes very strong compared to that of the AC. The mode illustrated in FIG. 4B shows a difference of about 40 dB (portion denoted by an arrow). Such a difference cannot be explained by only a reflection spectrum by the DFB but is due to amplification of the mode in the long wavelength by a non-linear interaction between modes such as a FWM while passing through the DFB. What is importance, here, is that the DFB reflector plays a crucial role in the passive mode locking.

Figure 5:
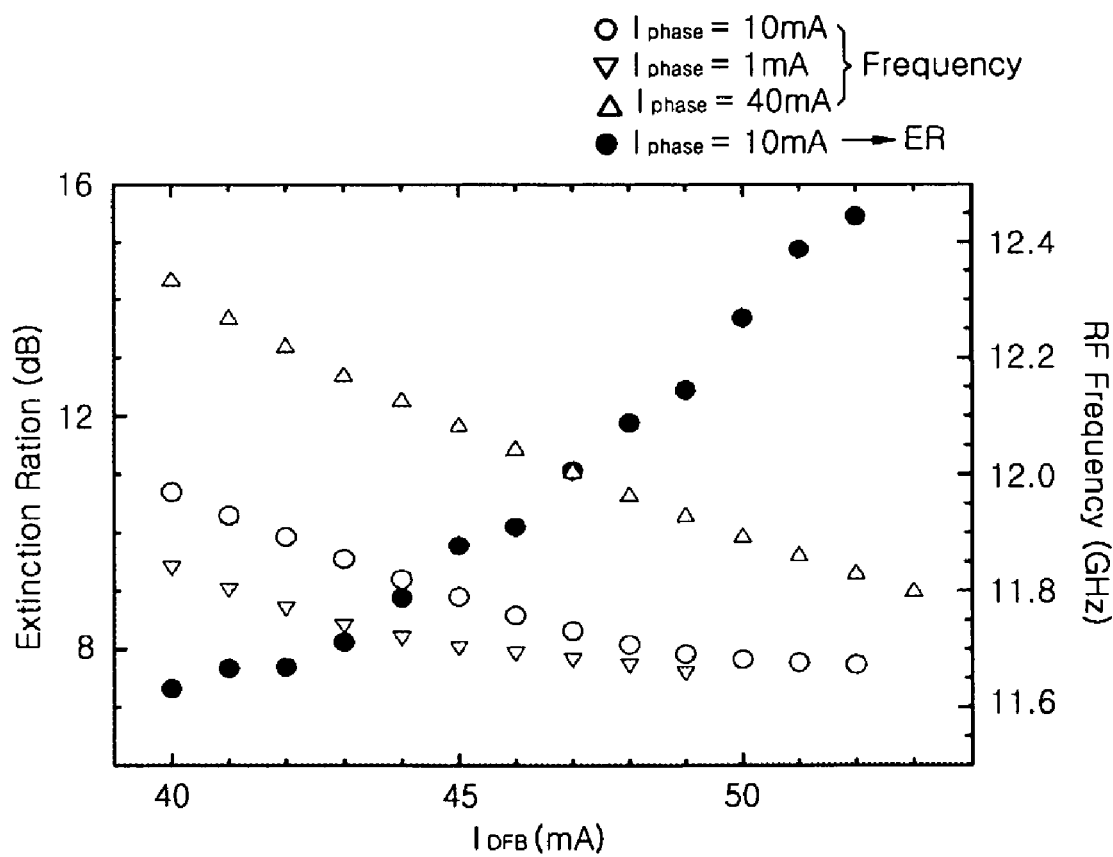
FIG. 5 is a graph illustrating frequency variations and extinction ratio variations according to a driving current.

FIG. 5 is a graph illustrating frequency variations and extinction ratio variations according to a driving current. Referring to FIG. 5, by using the DFB reflector, the frequency of a pulse is varied not only according to a current applied to the DFB sector but also according to a current applied to the phase control sector. That is, as a current applied to the DFB sector decreases and a current applied to the phase control sector increases, the frequency of an optical pulse increases. Due to such characteristics, as described above, the laser diode of the present invention has a wide frequency variation region. Also, the laser diode of the present invention has an extinction ratio greater than 8 dB, explaining swift pulse creation. When a current applied to the phase control sector is 10 mA, the extinction ratio (black spot) increases as the amount of a current applied to the DFB increases. Therefore, it is advantageous to increase the amount of a current applied to the DFB sector as much as possible in a range not exceeding the threshold current (55 mA).

Figure 6A:
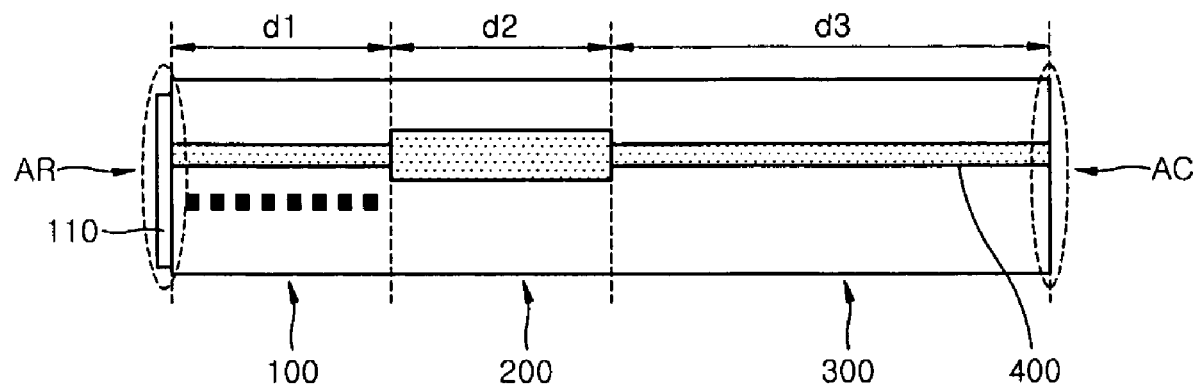
FIG. 6A is a schematic sectional view of a laser diode generating an optical pulse of 40 GHz or more according to a second embodiment of the present invention.

FIG. 6A is a schematic sectional view of a laser diode where a DFB sector 100 is 0.3 mm (d1) in length, a phase control sector 200 is 0.5 mm (d2) in length, and a gain sector 300 is 0.3 mm (d3) in length to test whether a structure using a DFB reflector operates in a range above 40 GHz.

Figure 6B:
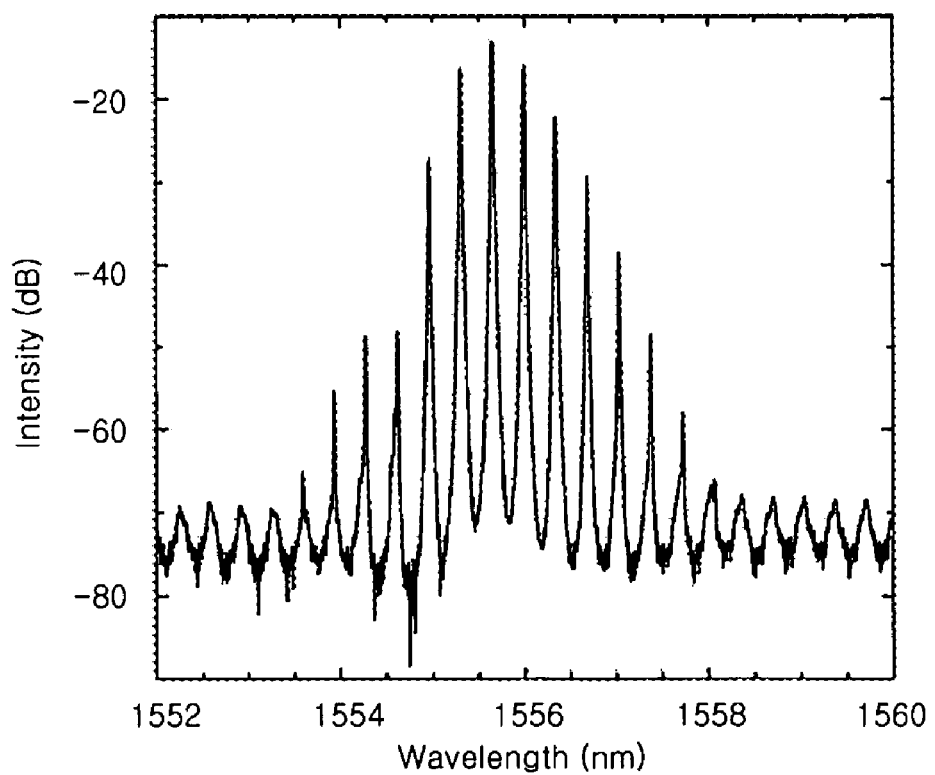
FIGS. 6B through 6D are graphs illustrating measurement data of optical pulses of the laser diode of FIG. 6A.
Figure 6C:
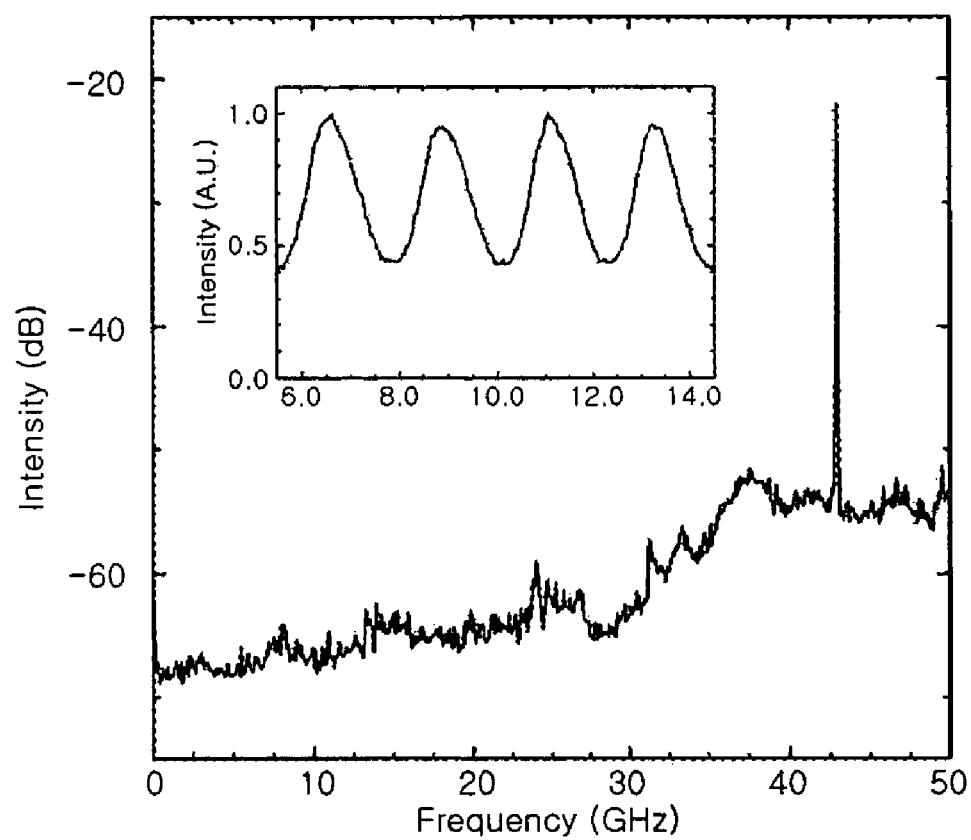
Figure 6D:
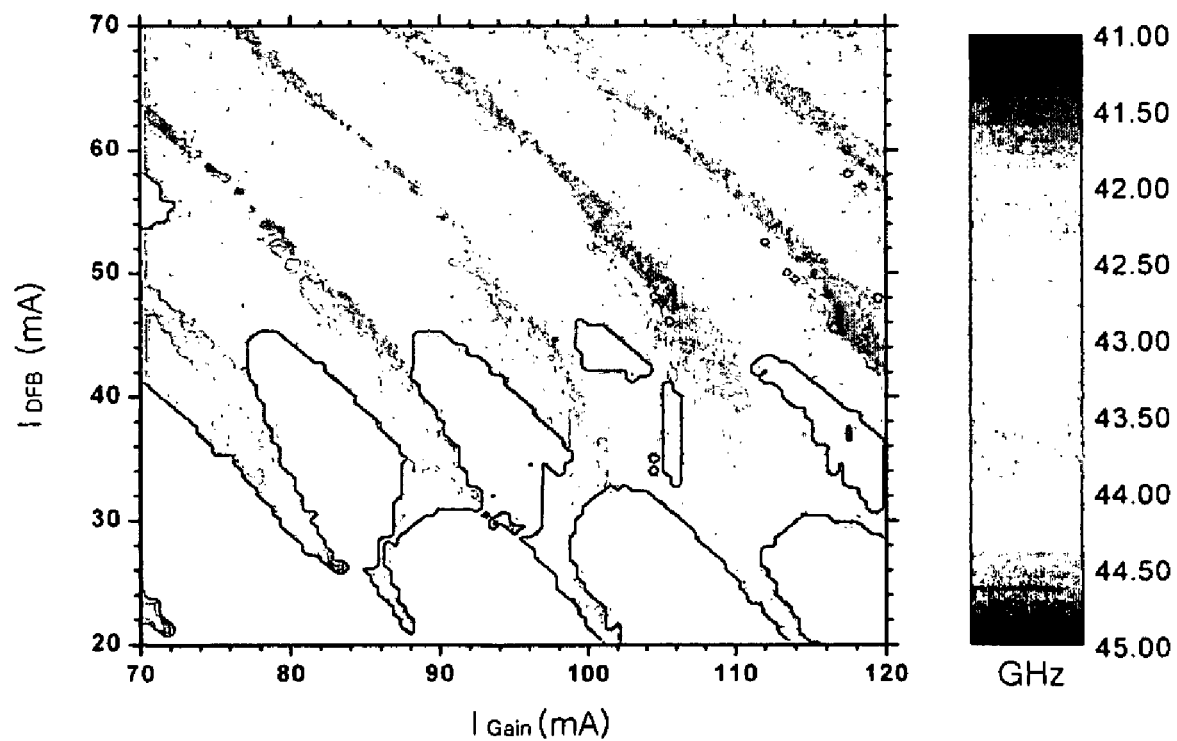

FIGS. 6B through 6D are graphs showing results of optical pulses measured at an AR of the laser diode of FIG. 6A. FIG. 6B is a graph illustrating an optical spectrum that measures an intensity according to the wavelength of a pulse. FIG. 6C is a graph illustrating an RF spectrum and measurements of intensity by autocorrelation trace. Here, the RF spectrum represents an intensity according to the frequency of a pulse and is illustrated in a wide rectangular part at the outer block, and the graph by the autocorrelation trace is illustrated in a small rectangular part in the inside. In the graph illustrating the intensity according to the frequency of the pulse, a peak is shown at a portion of 40 GHz, which shows that a relevant pulse is created at a frequency around 40 GHz. FIG. 6D is a frequency map of a pulse varied according to a current applied to the DFB sector and the gain sector.

The graphs show that a pulse is swiftly created also above 40 GHz when the DFB reflector is used. Therefore, the present invention may more swiftly create an optical pulse of a high frequency than the prior art laser diode using the mode beating by the DFB.

According to an experiment result, the number of modes involved in passive mode locking is determined by a mode interval determined by an entire cavity and the width of a reflection spectrum of the DFB. That is, since the mode interval is determined by the entire cavity's length and the mode is reflected in the DFB sector, the number of modes involved in the passive mode locking is determined by the number of modes included in the width of the DFB reflection spectrum. Therefore, the number of total modes is determined by a ratio of the mode interval to the width of the DFB reflection spectrum. On the basis of such results, it is possible to control the number of modes by varying the mode interval and the width of the DFB reflection spectrum. Also, since a pulse's width narrows as the number of modes increases, it is possible to control the pulse's width by controlling the number of modes. Here, it is possible to control the width of the DBF reflection spectrum by changing a lattice structure of the inside.

According to the present invention the laser diode, generating passive mode locking does not require a sector of an SA, manufacturing process is simple and convenient, and a frequency variable region extends compared to the prior art using the SA.

Also, the laser diode of the present invention has a single cavity resonator structure, the number of variables to be considered is small compared to the prior art using the SA, and it is possible to control the frequency of an optical pulse according to the amount of a current applied.

Furthermore, according to the present invention, it is possible to determine the number of modes depending on a ratio of an entire cavity's mode interval to the width of the DFB reflection spectrum, and thus control an optical pulse's width.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser diode generating passive mode locking, the laser diode comprising:
    a single DFB (distributed feedback) sector having a grating and a waveguide structure extending all the way through the single DFB sector such that serves as a reflector, as a frequency tuner, and as an extinction ratio adjuster when a current less than a threshold current is applied to the single DFB sector; and
    a gain sector connected to the single DFB sector and having an as-cleaved facet formed at the end of the gain sector.

2. The laser diode of claim 1, wherein the current applied to the single DFB sector is greater than about 70% of the threshold current.

3. The laser diode of claim 2, wherein the single DFB sector in cooperation with the gain sector becomes a single resonant cavity.

4. The laser diode of claim 1, wherein the gain sector is divided into at least two sections to receive a uniform current.

5. The laser diode of claim 1, further comprising a phase control sector between the single DFB sector and the gain sector.

6. The laser diode of claim 5, wherein creation and the frequency of the optical pulse by the laser diode is controlled by the amount of a current applied to the phase control sector.

7. The laser diode of claim 1, wherein the frequency of the optical pulse is varied by the amount of the current applied to the single DFB sector.

8. The laser diode of claim 1, wherein the number of modes and the width of the optical pulse are determined by a ratio of an entire cavity's mode interval to the width of the DFB reflection spectrum.

9. A method of creating an optical pulse, the method comprising:
    providing a laser diode including a single DFB sector having a grating and a waveguide structure extending all the way through the single DFB sector such that the single DFB sector serves as a reflector, as a frequency tuner, and as an extinction ratio adjuster, and a gain sector connected to the single DFB sector and having an as-cleaved facet formed at the end of the gain sector; and applying a current less than a threshold current to the single DFB sector of the laser diode to create an optical pulse by generating passive mode locking.

10. The method of claim 9, wherein the current applied to the single DFB sector is greater than about 70% of the threshold current.

11. The method of claim 9, wherein the gain sector is divided into at least two sections to receive a uniform current.

12. The method of claim 9, wherein the amount of the current applied to the single DFB sector is controlled to vary the frequency of the optical pulse.

13. The method of claim 9, wherein the amount of the current applied to the gain sector is controlled to vary the frequency of the optical pulse.

14. The method of claim 9, wherein the laser diode further includes a phase control sector between the single DFB sector and the gain sector, and a current is applied to the phase control sector to control creation and the frequency of the optical pulse of the laser diode.

15. The method of claim 9, wherein a ratio of an entire cavity's mode interval to the width of the single DFB reflection spectrum is controlled to determine the number of modes and the width of the optical pulse.

16. The laser diode of claim 1, wherein the threshold current is less than or equal to about 55 mA.

17. The laser diode of claim 9, wherein the frequency of the optical pulse is around 40 GHz.

18. The method of claim 9, wherein the threshold current is less than or equal to about 55 mA.

19. The method of claim 18, wherein the frequency of the optical pulse is around 40 GHz.

20. The method of claim 1, wherein the threshold current (IDFB) is between about 40 to 54 mA.

* * * * *